US011656290B2

(12) United States Patent
Nagai et al.

(10) Patent No.: US 11,656,290 B2
(45) Date of Patent: May 23, 2023

(54) BATTERY SYSTEM AND METHOD FOR EVALUATING LITHIUM-ION BATTERY DEGRADATION

(71) Applicant: Toyota Jidosha Kabushiki Kaisha, Toyota Aichi-ken (JP)

(72) Inventors: Hiroki Nagai, Aichi-ken (JP); Hiroki Tashiro, Nisshin (JP); Yoshihiro Uchida, Nagakute Aichi-ken (JP); Mitsuhiro Kuzuba, Kasugai (JP); Yuki Sugo, Toyota (JP)

(73) Assignee: TOYOTA JIDOSHA KABUSHIKI KAISHA, Toyota Aichi-ken (JP)

( * ) Notice: Subject to any disclaimer, the term of this patent is extended or adjusted under 35 U.S.C. 154(b) by 181 days.

(21) Appl. No.: 17/158,361

(22) Filed: Jan. 26, 2021

(65) Prior Publication Data

US 2021/0231745 A1 Jul. 29, 2021

(30) Foreign Application Priority Data

Jan. 29, 2020 (JP) .............................. JP2020-012450

(51) Int. Cl.
*G01R 31/392* (2019.01)
*B60L 50/64* (2019.01)
(Continued)

(52) U.S. Cl.
CPC ............ *G01R 31/392* (2019.01); *B60L 50/64* (2019.02); *B60L 58/12* (2019.02);
(Continued)

(58) Field of Classification Search
CPC ................ G01R 31/392; G01R 31/367; G01R 31/3648; G01R 31/382; G01R 31/387;
(Continued)

(56) References Cited

U.S. PATENT DOCUMENTS

2017/0038435 A1* 2/2017 Mitsuhashi .......... G01R 31/389
2017/0151880 A1* 6/2017 Nakashima ......... B60L 11/1816
2017/0250543 A1* 8/2017 Kanada ................. H02J 7/0029

FOREIGN PATENT DOCUMENTS

| JP | 5772965 B2 | 9/2015 |
| JP | 2016-143546 A | 8/2016 |
| JP | 2017-103080 A | 6/2017 |

* cited by examiner

*Primary Examiner* — Tarun Sinha
*Assistant Examiner* — Lal C Mang
(74) *Attorney, Agent, or Firm* — Dinsmore & Shohl LLP

(57) ABSTRACT

ECU evaluates high-rate degradation of a lithium-ion battery, using a score and an in-plane score. The score is an index for evaluating unevenness in salt concentration of an electrode body in a lamination direction of the electrode body. The in-plane score is an index for evaluating unevenness in salt concentration of the electrode body in an in-plane direction of the electrode body. For each computing cycle, ECU calculates a current score, and calculates a current in-plane score based on an SOC (State Of Charge) of the lithium-ion battery. When the absolute value of an in-plane integrated score is beyond a reference value, ECU evaluates the high-rate degradation based on the current score, the current in-plane score, and a degradation score which is obtained by integrating previous scores beyond a deadband. When the absolute value is below the reference value, ECU evaluates the high-rate degradation, based on the degradation score.

6 Claims, 9 Drawing Sheets

(51) Int. Cl.
*B60L 58/12* (2019.01)
*H01M 10/0525* (2010.01)
*H01M 10/44* (2006.01)
*H01M 10/48* (2006.01)

(52) U.S. Cl.
CPC ....... *H01M 10/0525* (2013.01); *H01M 10/44* (2013.01); *H01M 10/486* (2013.01); *H01M 2220/20* (2013.01)

(58) Field of Classification Search
CPC ... G01R 19/16542; B60L 50/64; B60L 58/12; H01M 10/0525; H01M 10/44; H01M 10/486; H01M 10/425; H01M 10/4285; H01M 10/4207; H01M 10/482; H01M 10/058; H01M 2220/20; H01M 2010/4271; Y02E 60/10; Y02T 10/70
See application file for complete search history.

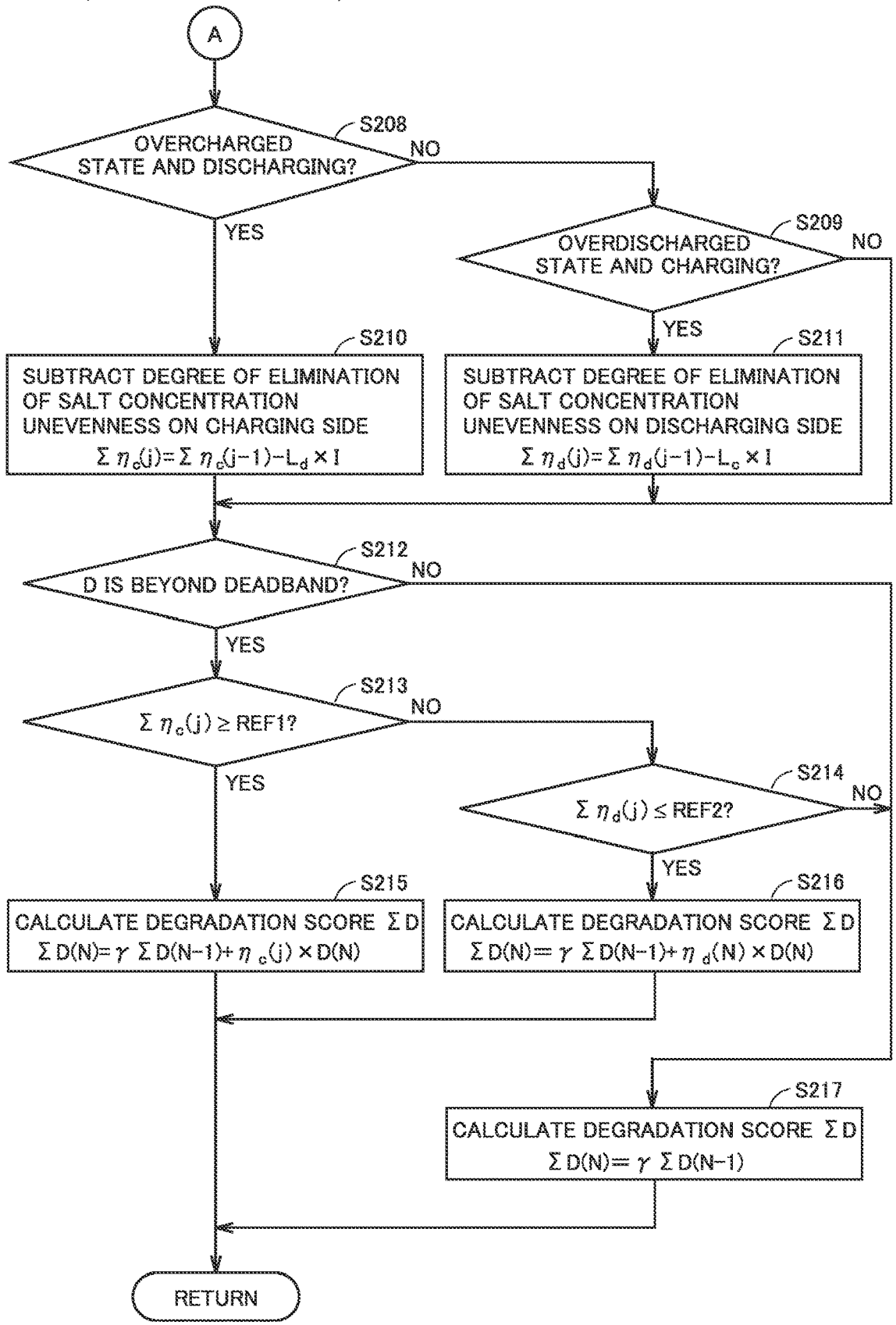

BATTERY SYSTEM AND METHOD FOR EVALUATING LITHIUM-ION BATTERY DEGRADATION

CROSS REFERENCE TO RELATED APPLICATIONS

This nonprovisional application claims priority to Japanese Patent Application No. 2020-012450 filed on Jan. 29, 2020, with the Japan Patent Office, the entire content of which is hereby incorporated by reference.

BACKGROUND

Field

The present disclosure relates to a battery system and a method for evaluating the degradation of a lithium-ion battery, and, more particularly, to a technique for evaluating a degree of progression of high-rate degradation of the lithium-ion battery.

Description of the Background Art

Lithium-ion batteries have characteristics of having higher energy density than other secondary batteries, such as nickel-hydrogen batteries. For this reason, in recent years, the lithium-ion batteries are increasingly employed as a secondary battery for running a vehicle.

As a large current is continuously charged or discharged in a lithium-ion battery, the internal resistance of the lithium-ion battery can increase temporarily (irreversibly) due to the unevenness in the lithium-ion concentration distribution within the electrode body. If such a condition continues, degradation of the lithium-ion battery results. Such degradation is also called "high-rate degradation."

Japanese Patent Laying-Open No. 2017-103080 discloses a battery system that is configured to calculate a score D(N), which is calculated to quantitatively evaluate the unevenness in the ion concentration in an electrolyte solution in the lithium-ion battery.

SUMMARY

There is always a demand for technologies for evaluating with high accuracy a degree of progression of the high-rate degradation of a lithium-ion battery. Accordingly, it is desirable that the accuracy in the evaluation of a degree of progression of the high-rate degradation be better than the battery system disclosed in Japanese Patent Laying-Open No. 2017-103080.

The present disclosure is made to solve the above problem, and an object of the present disclosure is to provide improved evaluation of the degree of progression of the high-rate degradation of a lithium-ion battery included in a battery system.

(1) A battery system according to a certain aspect of the present disclosure includes a lithium-ion battery, a current sensor, and a processor. The lithium-ion battery is impregnated in an electrolyte solution, and includes an electrode body including a positive electrode and a negative electrode, each being a planar electrode, being laminated each other. The current sensor detects a current charged to and discharged from the lithium-ion battery. The processor evaluates degradation of the lithium-ion battery, using a first score and a second score, the degradation being a phenomenon that an internal resistance of the lithium-ion battery increases with development of unevenness in a lithium-ion concentration distribution within the electrode body. The first score (D, described below) is an index for evaluating the unevenness in lithium-ion concentration distribution in a lamination direction in which the positive electrode and the negative electrode are laminated. The second score ($\eta$, described below) is an index for evaluating the unevenness in lithium-ion concentration distribution in an in-plane direction of the positive electrode and the negative electrode. For each computing cycle, the processor calculates a current first score based on a detection value of the current sensor, and calculates a current second score based on an SOC (State Of Charge) of the lithium-ion battery. The processor, when an absolute value of a second integrated value ($\Sigma\eta$) obtained by integrating the second score is beyond a reference value, evaluates the degradation of the lithium-ion battery based on the current first score (D), the current second score ($\eta$), and a first integrated value ($\Sigma D$) which is obtained by integrating previous first scores beyond a predetermined range, and when the absolute value is below the reference value, evaluates the degradation of the lithium-ion battery based on the first integrated value ($\Sigma D$).

(2) The processor: corrects the first integrated value using a correction coefficient representing mitigation of the unevenness in lithium-ion concentration distribution over time; when the absolute value is beyond the reference value, evaluates the degradation of the lithium-ion battery by adding a product of the current first score and the current second score to the first integrated value corrected by the correction coefficient; and when the absolute value is below the reference value, evaluates the degradation of the lithium-ion battery based on the first integrated value corrected by the correction coefficient.

According the configurations described in (1), (2) above, the second score is calculated, in addition to the first score. Although described in detail below, by introducing the second score, a degree of progression of unevenness in lithium-ion concentration distribution within the electrode body can be more accurately quantified by taking into account the order of development of unevenness in lithium-ion concentration distribution in the lamination direction and the in-plane direction and the SOC dependency of the susceptibility of lithium-ion concentration distribution to unevenness in the in-plane direction. Thus, the accuracy in evaluation of the degree of progression of the high-rate degradation of the lithium-ion battery can be improved.

(3) When an amount of electrical charges charged to the lithium-ion battery in an overdischarged state is beyond a first decision value or when an amount of electrical charges discharged from the lithium-ion battery in an overcharged state is beyond a second decision value, the processor resets the second integrated value.

In the configuration described in (3) above, when the amount of electrical charges charged to the lithium-ion battery in the overdischarged state exceeds the first decision value or when the amount of electrical charges discharged from the lithium-ion battery in the overcharged state exceeds the second decision value, that is, when the directions of charge and discharge are switched, the second integrated value is reset (a reset scheme). According to the configuration described in (3) above, the elimination of the unevenness in lithium-ion concentration distribution can be represented by simple arithmetic operations.

(4) The processor subtracts the current second score from the second integrated value for each computing cycle when the lithium-ion battery in the overdischarged state is being charged or when the lithium-ion battery in the overcharged state is being discharged.

In the configuration described in (4) above, with the subtraction scheme, a degree of elimination of the unevenness in lithium-ion concentration distribution in the in-plane direction is sequentially subtracted after the directions of charge and discharge are switched (a subtraction scheme). This scheme well represents gradual mitigation of the unevenness in lithium-ion concentration distribution. Thus, according to the configuration described in (4) above, elimination of the unevenness in lithium-ion concentration distribution can be more accurately represented.

(5) The battery system further includes a temperature sensor that detects a temperature of the lithium-ion battery. The processor calculates the second score based on the SOC and the temperature of the lithium-ion battery.

According to the configuration described in (5), the temperature dependency being taken into account, in addition to the SOC dependency, allows the second score to be calculated with more accuracy.

(6) In a method for evaluating degradation of a lithium-ion battery, according to other aspect of the present disclosure, the lithium-ion battery is impregnated in an electrolyte solution and includes an electrode body including a positive electrode and a negative electrode, each being a planar electrode, being laminated each other. The degradation of the lithium-ion battery is evaluated, using a first score and a second score, the degradation being a phenomenon that an internal resistance of the lithium-ion battery increases with development of an unevenness in a lithium-ion concentration distribution within the electrode body. The first score is an index for evaluating the unevenness in lithium-ion concentration distribution in a lamination direction in which the positive electrode and the negative electrode are laminated. The second score is an index for evaluating the unevenness in lithium-ion concentration distribution in an in-plane direction of the positive electrode and the negative electrode. The method includes a first step, a second step, and a third step. The first step is, for each computing cycle, calculating a current first score based on a current charged to and discharged from the lithium-ion battery, and calculating a current second score based on an SOC of the lithium-ion battery. The second step is, when an absolute value of a second integrated value obtained by integrating the second score is beyond a reference value, evaluating the degradation of the lithium-ion battery based on the current first score, the current second score, and a first integrated value which is obtained by integrating previous first scores beyond a predetermined range. The third step is, when the absolute value is below the reference value, evaluating the degradation of the lithium-ion battery based on the first integrated value.

According to the method described in (6) above, as with the configuration described in (1) above, the accuracy in calculation of the internal resistance of the lithium-ion battery can be improved.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 12 is a flowchart showing a procedure of a degradation score calculation process with a subtraction scheme.

DETAILED DESCRIPTION

Figure 1:
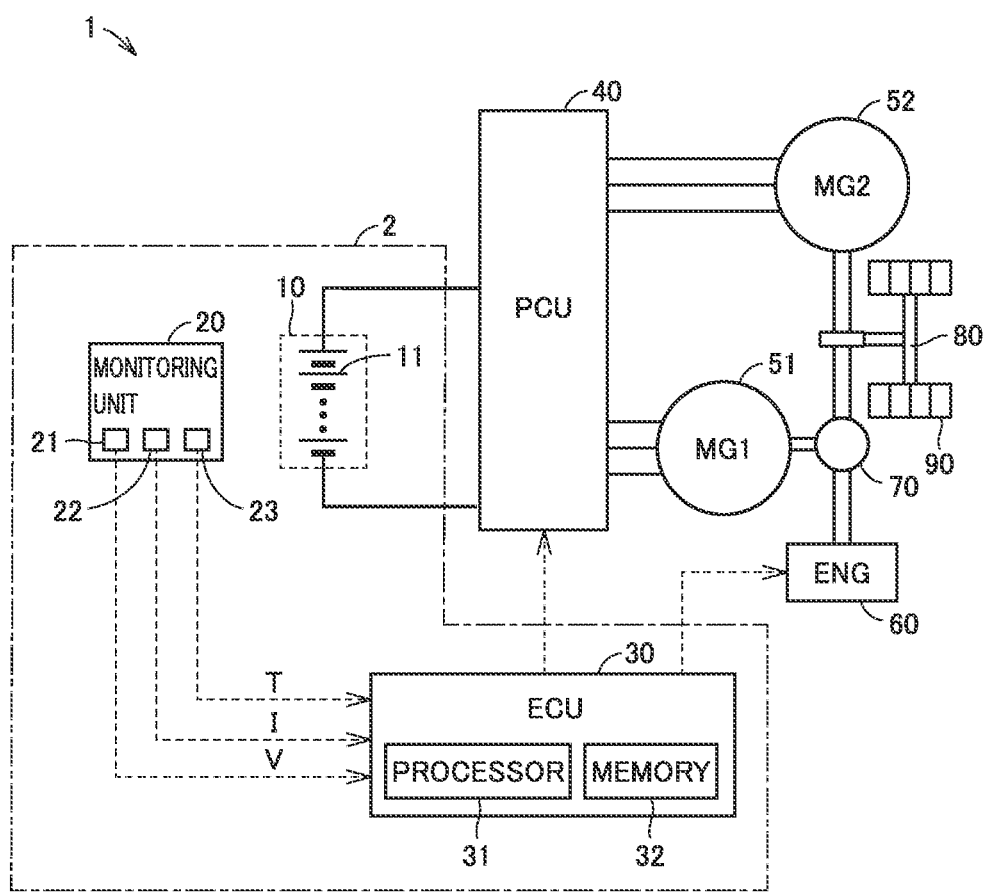
FIG. 1 is a diagram schematically showing an overall configuration of a vehicle having a battery system according to Embodiment 1 mounted thereon.

Hereinafter, embodiments will be described, with reference to the accompanying drawings. Note that like reference signs are used to refer to like or corresponding parts in the drawings, and the description thereof will not be repeated. The embodiments shown below will be described with reference to a battery system according to the present disclosure being mounted on a vehicle. However, the application of the battery system according to the present disclosure is not limited to vehicles, and may be stationary applications, for example.

Embodiment 1

<Overall Configuration of Battery System>

FIG. 1 is a diagram schematically showing an overall configuration of a vehicle having a battery system according to Embodiment 1 mounted thereon. A vehicle 1 is, representatively, a hybrid vehicle (HV). However, the battery system according to the present disclosure is not limited to HV, and is applicable to vehicles in general that have a battery mounted thereon. Therefore, vehicle 1 may be a plug-in hybrid vehicle (PHV), electric vehicle (EV), or fuel cell vehicle (FCV), etc.

Vehicle 1 includes a battery system 2. Battery system 2 includes a battery 10, a monitoring unit 20, and an electronic control unit (ECU) 30. Battery system 2 monitors and diagnoses the status of battery 10. Besides the battery system 2, vehicle 1 includes a power control unit (PCU) 40, motor generators 51, 52, an engine 60, a power split device 70, a drive shaft 80, and driving wheels 90.

Battery 10 is a battery pack which includes multiple cells 11. Each cell 11 is a secondary battery which contains a nonaqueous electrolyte solution, specifically, a lithium-ion battery. A configuration of cell 11 will be described in more detail, with reference to FIGS. 2 and 3. Battery 10 stores power for driving motor generators 51, 52, and supplies motor generators 51, 52 with the power through PCU 40. As motor generators 51, 52 generate power, battery 10 also charges power with supply of the generated power through PCU 40.

Monitoring unit 20 includes a voltage sensor 21, a current sensor 22, and a temperature sensor 23. Voltage sensor 21 detects a voltage V of each of the multiple cells 11. Current sensor 22 detects a current I that is charged to and discharged from battery 10. Temperature sensor 23 detects a temperature T for each block (also referred to as a module) formed of multiple cells 11. Each sensor outputs a result of the detection to ECU 30.

Note that the monitor unit for each sensor is not limited particularly, and may be a cell unit, an adjacent multiple-cell unit, a block unit, or the entire battery 10. In the following, battery 10 may be simply described so, indistinctively with respect to the internal configuration thereof.

Consider that the direction in which current I is discharged from battery 10 is a positive direction, and the direction in which current I is charged to battery 10 is a negative direction. The same is true for the power that is charged to and discharged from battery 10.

ECU 30 includes a processor 31, such as a central processing unit (CPU), a memory 32, such as a read only memory (ROM) and a random access memory (RAM), and input/output ports (not shown) for receiving and outputting various signals. ECU 30 performs various processes for controlling vehicle 1 to a desired state, based on signals received from sensors, and programs and maps stored in memory 32. More specifically, ECU 30 controls engine 60 and PCU 40, thereby controlling the charging and discharging of battery 10. For example, ECU 30 also diagnoses the presence or absence of abnormality in battery 10, and evaluates the state of degradation of battery 10. The evaluation of the state of degradation will be described below in detail.

Note that ECU 30 may be divided into multiple ECUs by function. For example, ECU 30 can be divided into an ECU (battery ECU) dedicated to monitor, diagnose, and evaluate the battery 10, an ECU (engine ECU) dedicated to control the engine 60, and an ECU (HV ECU) dedicated to control the entirety of vehicle 1.

PCU 40 performs bidirectional power conversion between battery 10 and motor generators 51, 52, in accordance with control signals from ECU 30. PCU 40 may be capable of separately controlling the statuses of motor generators 51, 52. In this case, PCU 40 includes, for example, two inverters which are provided in one-to-one correspondence with motor generators 51, 52, and a converter that boosts the DC voltage, to be supplied to each inverter, higher than an output voltage of battery 10 (none of which are shown).

Motor generators 51, 52 are each an alternating-current (AC) rotating electric machine, for example, a three-phase AC synchronous motor which includes a rotor having a permanent magnet (not shown) embedded therein. Motor generator 51 is primarily used as a generator which is driven by engine 60 via power split device 70. The power generated by motor generator 51 is supplied to motor generator 52 or battery 10 via PCU 40. Motor generator 52 primarily operates as an electric motor. Motor generator 52 is driven with supply of at least one of the power from battery 10 and the power generated by motor generator 51, and the driving force of motor generator 52 is conveyed to drive shaft 80. In contrast, upon breaking of the vehicle or as the acceleration is slowing down on a descending slope, motor generator 52 operates as a generator for power regeneration. The power generated by motor generator 52 is supplied to battery 10 via PCU 40.

Engine 60 is an internal combustion engine, such as a gasoline engine, a diesel engine, etc. Engine 60 converts combustion energy which is generated when an air-fuel mixture is combusted, into kinetic energy for kinetic elements (such as a piston and a rotor), thereby outputting mechanical power.

Power split device 70 includes a planetary gear mechanism (not shown) having, for example, three rotation shafts: a sun gear; a carrier; and a ring gear. Power split device 70 divides the mechanical power, output from engine 60, into mechanical power for driving the motor generator 51 and mechanical power for driving the driving wheels 90.

<Cell Configuration>

Figure 2:
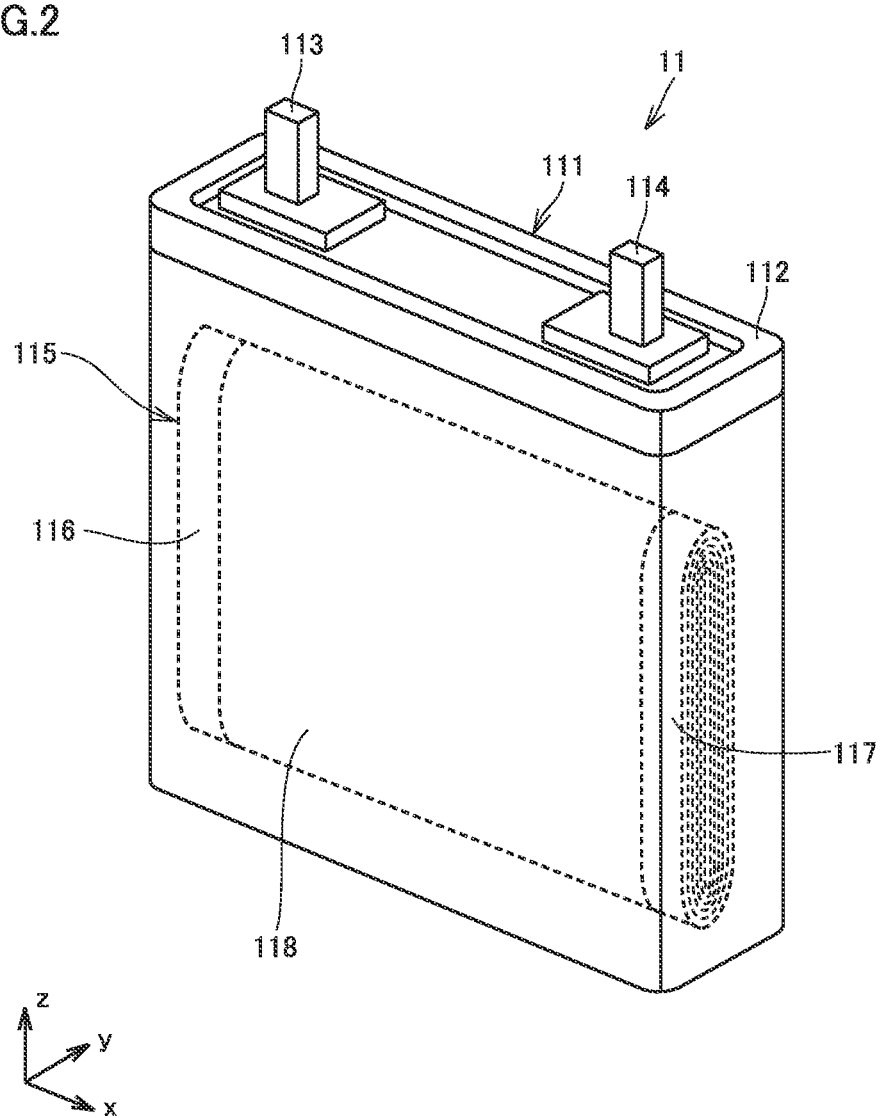
FIG. 2 is a diagram showing a configuration of each cell in more detail.

FIG. 2 is a diagram showing a configuration of each cell 11 in more detail. The cell 11 is shown FIG. 2, transparently showing the inside.

Cell 11 has a battery case 111 that is, for example, in a rectangular shape (a generally parallelepiped shape). Battery case 111 has the upper surface sealed with a lid 112. One end of a positive terminal 113 and one end of a negative terminal 114 of battery case 111 project out of battery case 111 through lid 112. The other end of positive terminal 113 and the other end of negative terminal 114 are connected to an internal positive terminal and an internal negative terminal (none of which are shown), respectively, within battery case 111. Battery case 111 accommodates an electrode body 15 therein. Electrode body 115 is formed by laminated positive electrode 116, a separator 118, and negative electrode 117 in the listed order and winding the lamination.

The x direction in the figure is along the surfaces of layers of positive electrode 116, negative electrode 117, and separator 118. This direction will be hereinafter referred to as an "in-plane direction." The y direction is along the direction in which the above layers are laminated. This direction will be hereinafter referred to as a "lamination direction."

Figure 3:
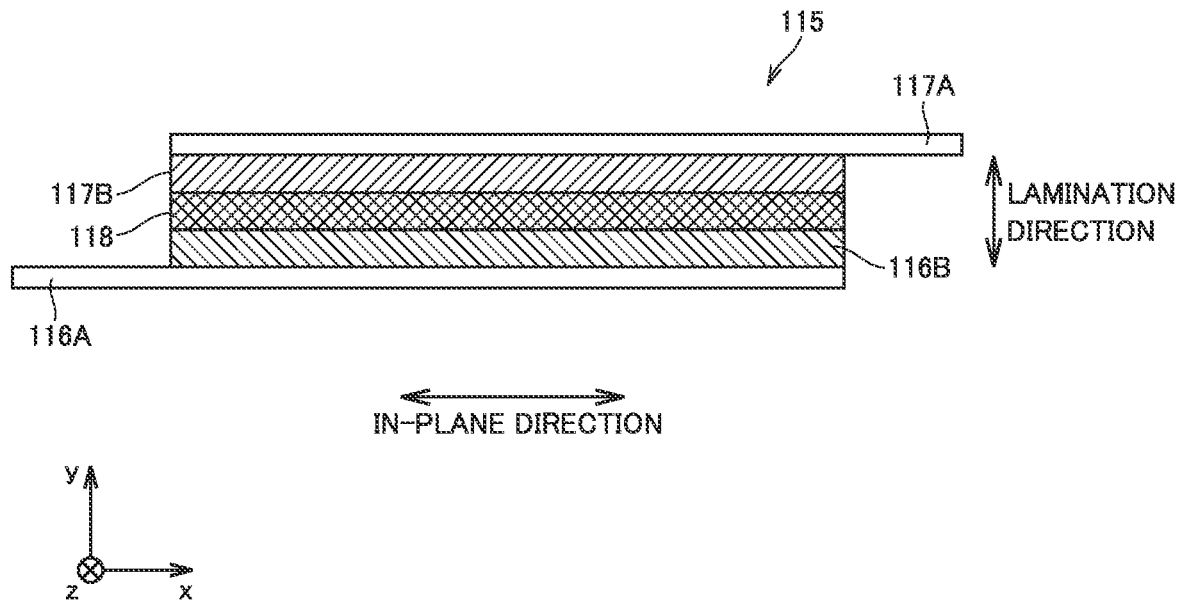
FIG. 3 is a diagram for illustrating a configuration of an electrode body in more detail.

FIG. 3 is a diagram for illustrating the configuration of electrode body 15 in more detail. In FIG. 3, for purposes of simplification, one layer of positive electrode 116, one layer of negative electrode 117, and one layer of separator 118 are illustrated.

Positive electrode 116 includes a positive current collector foil 116A and a positive active material layer 116B (a layer containing a positive active material, a conductive material, and a binder) formed on positive current collector foil 116A. Similarly, negative electrode 117 includes a negative current collector foil 117A and a negative active material layer 117B (a layer containing a negative active material, a conductive material, and a binder) formed on negative current collector foil 117A. Separator 118 is disposed in contact with positive active material layer 116B and negative active material layer 117B. Positive active material layer 116B, negative active material layer 117B, and separator 118 are impregnated in the electrolyte solution.

For positive active material layer 116B, negative active material layer 117B, separator 118, and the electrolyte solution, conventionally well-known materials for the positive active material, the negative active material, the separator, and the electrolyte solution of the lithium-ion battery can be used. By way of example, a ternary material in which some of lithium cobalt oxide is substituted by nickel and/or manganese, can be used for positive active material layer 116B. For negative active material layer 117B, for example, graphite can be used. A polyolefin (e.g., polyethylene or polypropylene) can be used for separator 118. The electrolyte solution includes an organic solvent (e.g., a mixed solvent of DMC (dimethyl carbonate), EMC (ethyl methyl carbonate), and EC (ethylene carbonate)), lithium salt (e.g., $LiPF_6$), an additive (e.g., LiBOB (lithium bis(oxalate)borate) or $Li[PF_2(C_2O_4)_2]$), etc.

Note that the configuration of cell 11 described above is by way of example. For example, the electrode body of cell 11 may have a lamination structure, rather than the wound structure. The battery case is not limited to the rectangular battery case, and a cylindrical or laminate battery case can also be employed.

<High-Rate Degradation>

In battery 10 thus configured, if a large current (high-rate current) is continuously charged or discharged, "high-rate degradation" can result. The high-rate degradation refers to a degradation phenomenon that the internal resistance of battery 10 is increased in part due to an unevenness in the lithium-ion concentration distribution within electrode body 15. In the following, the lithium-ion concentration distribution is also referred to as a "salt concentration distribution," and the unevenness in the lithium-ion concentration distribution is also referred to as an "unevenness in salt concentration." ECU 30 calculates a "degradation score ΣD" for evaluating a degree of progression of the high-rate degradation of battery 10 based on the unevenness in salt concentration. Then, in response to the calculated degradation score ΣD, ECU 30 performs a control for suppressing the high-rate degradation of battery 10 (a high-rate degradation suppression control).

Figure 4:
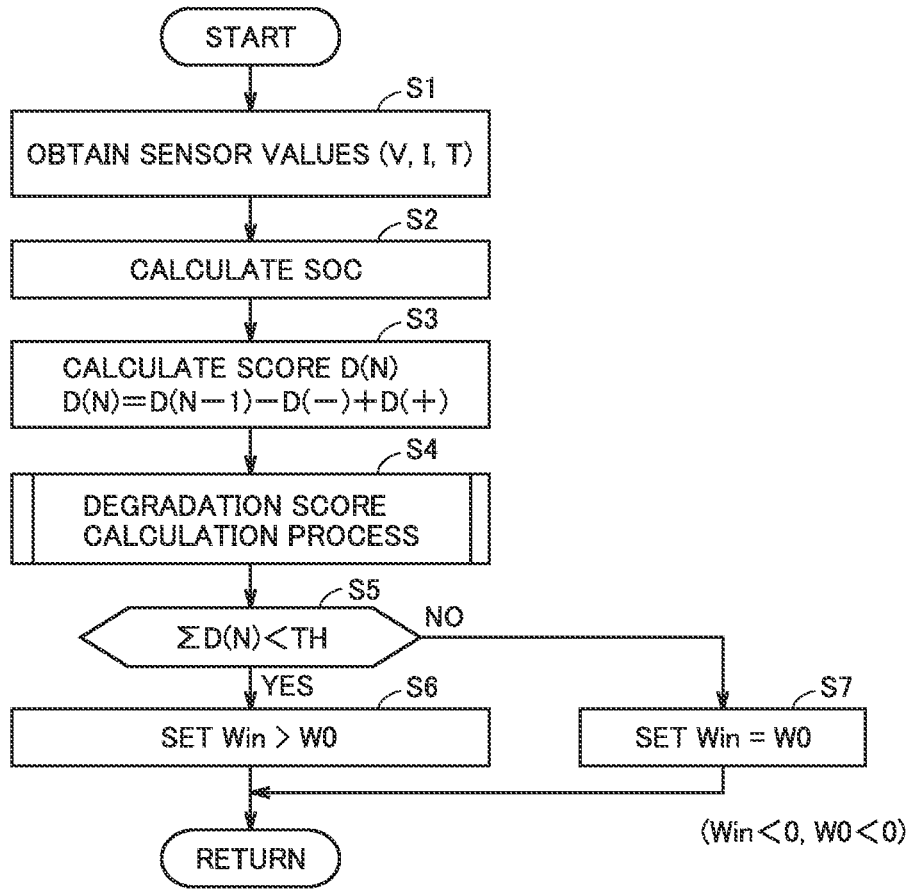
FIG. 4 is a flowchart showing a control for suppressing the high-rate degradation of a battery in Embodiment 1.

FIG. 4 is a flowchart showing the high-rate degradation suppression control according to Embodiment 1. The control illustrated in the flowchart is repeated for each predetermined computing cycle Δt. Each step is implemented by software processing by ECU 30. However, each step may be implemented by hardware (electric circuit) provided within ECU 30. Hereinafter, each step is abbreviated as S.

In S1, ECU 30 reads a detection value of each sensor included in monitoring unit 20. This allows voltage V and current I, and temperature T of battery 10 to be obtained.

In S2, ECU 30 calculates SOC of battery 10, for example, based on current I obtained in S1. Note that as a method of calculation of SOC, a well-known method can be employed as appropriate, such as a current integrating (Coulomb counting) method or an OCV (open circuit voltage)-based method.

In S3, ECU 30 calculates a score D for calculating a degradation score ΣD, taking into account both an increase and reduction in unevenness in salt concentration associated with charging and discharging of battery 10. The score that is calculated at the N-th (the current) computing cycle will be represented as D(N), and the score that is calculated at the (N−1)-th (the immediately preceding) computing cycle will be represented as D(N−1), where N is a natural number. Score D(N) is calculated according to the following Equation (1) which is a recursion formula, where an initial value D(0) for the score is set to zero, for example.

$$D(N)=D(N-1)-D(-)+D(+) \quad (1)$$

In Equation (1), a reduction D(−) of the score represents a reduction in the unevenness in salt concentration that is caused by the lithium-ion diffusing in a time period from the immediately preceding score calculation until the current score calculation (during a computing cycle Δt). Reduction D(−) can be calculated, using a forgetting factor α, as indicated by the following Equation (2), where 0<α×Δt<1.

$$D(-)=\alpha \times \Delta t \times D(N-1) \quad (2)$$

Forgetting factor α corresponds to the rate of diffusion of the lithium-ion in the electrolyte solution, and depends on temperature T and SOC of battery 10. Due to this, forgetting factor α, and the correlation of temperature T and SOC are acquired in advance through experiment or simulation, and stored in memory 32 of ECU 30 as a map or a transform. Forgetting factor α can be calculated from temperature T and SOC by reference to the map or the transform. The same is true for a current coefficient Φ and a limit threshold C described below. Forgetting factor α, current coefficient β, and limit threshold C all have a positive value.

Returning to Equation (1), an increase D(+) of the score represent an increase in the unevenness in salt concentration that is caused by charging or discharging of battery 10 in a time period from the immediately preceding score calculation until the current score calculation (during an computing cycle Δt). The increase D(+) can be calculated, using current coefficient β, limit threshold C, and current I, as indicated by Equation (3):

$$D(+)=(\beta/C) \times I \times \Delta t \quad (3)$$

In Equation (3), discharging current I>0 when battery 10 is being discharged, and thus the increase D(+) is a positive value. The greater the magnitude |I| of the discharging current and the longer the computing cycle Δt, the greater the score D(N) changes in the positive direction. In contrast, the charging current I<0 when battery 10 is being charged, and thus the increase D(+) is a negative value. The greater the magnitude |I| of the charging current and the longer the computing cycle Δt, the greater the score D(N) changes in the negative direction. Thus, it is understood that the increase D(+) indicates an increase in unevenness in salt concentration that is cause by charging or discharging of battery 10.

In Equation (1), "−D(−)" is a term which causes score D(N) to change toward zero. As can be seen from Equation (2), the greater the forgetting factor α and the longer the computing cycle Δt, the faster the score D(N) approaches zero. Thus, it is understood that decrement D(−) indicates a decrease in (recovery from) the unevenness in salt concentration associated with diffusion of the lithium-ion.

In S4, based on score D(N) calculated in S3, ECU 30 calculates a degradation score ΣD(N) (a degradation score calculation process). Degradation scores ΣD(N) may be separately calculated, one for evaluating an overdischarged state of battery 10 and the other for evaluating an overcharged state of battery 10 (e.g., see Japanese Patent Laying-Open No. 2017-103080). In the example shown in FIG. 4, for ease of understanding of the characteristics of the present disclosure, while avoiding complicated description, an example will be described in which degradation score ΣD is used to evaluate the overcharged state of battery 10.

As degradation score ΣD(N) exceeds a predetermined threshold TH, ECU 30 reduces the absolute value of an upper control limit for the power to be charged to battery 10 (a charging power upper limit Win), thereby reducing the charging of battery 10. Charging power upper limit Win is set within a range of Win≤0, and charging of battery 10 is not permitted when Win=0. Such charging limit can suppress battery 10 from being further degraded by high rate charging.

Specifically, in S5, ECU 30 compares degradation score ΣD(N) (ΣD(N)<0) with threshold TH (TH<0). If ΣD(N)≥TH, that is, degradation score ΣD(N) is not beyond threshold TH (NO in S5), ECU 30 sets charging power upper limit Win to W0 (Win=W0<0) (S7). W0 is a default value and determined, for example, based on the rated output power of battery 10. W0 may be set variably, in response to temperature T or SOC of battery 10.

In contrast, when ΣD(N)<TH, that is, degradation score ΣD(N) is beyond threshold TH (YES in S5), ECU 30 sets charging power upper limit Win to a value less than a default value W0 (Win<W0<0) (S6). In this manner, compared to prior to degradation score ΣD(N) exceeding threshold TH, after degradation score ΣD(N) has exceeded threshold TH, battery 10 can be suppressed from being further degraded by the high rate charging by reducing the magnitude of charging power upper limit Win. Note that increasing the restriction on the magnitude of charging power upper limit Win is also referred to as Win involvement.

<Deadband>

Figure 5:
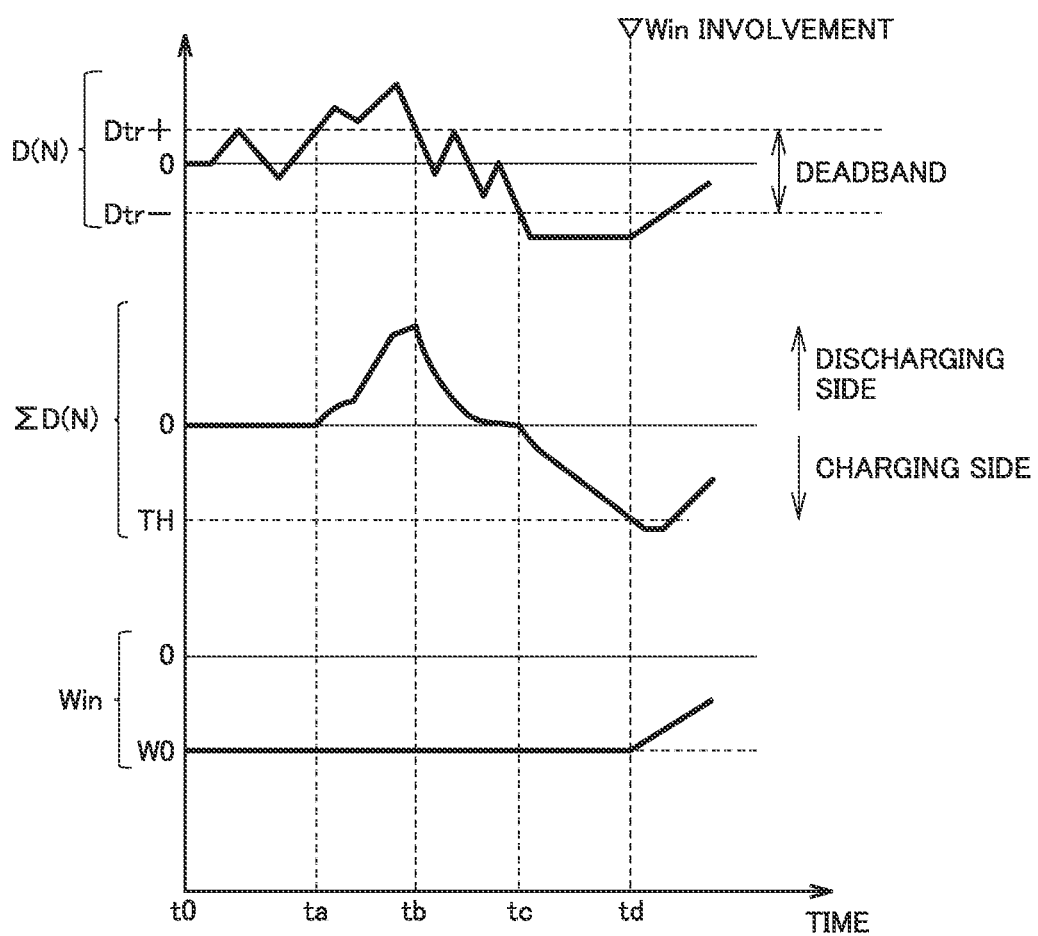
FIG. 5 is a time diagram showing one example of the control for suppressing the high-rate degradation of the battery in Embodiment 1.

FIG. 5 is a time diagram showing one example of the high-rate degradation suppression control according to Embodiment 1. In FIG. 5, an elapsed time is represented on the horizontal axis. From top to bottom, score D(N), degradation score ΣD(N), and charging power upper limit Win are represented on the vertical axis.

The initial value of score D(N) is zero at the initial time t0, assuming that, in this condition, the salt concentration is even. Then, as mentioned above, as battery 10 is discharged, score D(N) increases in the positive direction, whereas score D(N) increases in the negative direction as battery 10 is charged (see Equations (1) through (3)).

In the present embodiment, two thresholds Dtr+, Dtr− are set with respect to score D(N) for battery 10 on a charging side. The range defined by these thresholds will be referred to as a "deadband." The deadband corresponds to a "predetermined range" according to the present disclosure.

For periods in which score D(N) is beyond the deadband, that is, periods where D(N)>Dtr+ or periods where D(N)<Dtr−, score D(N) is added to degradation score ΣD(N−1). In contrast, for periods in which score D(N) is within the deadband, that is, periods where Dtr−≤D(N)≤Dtr+, score D(N) is not added to degradation score ΣD(N−1).

In the example shown in FIG. 5, score D(N) is within the deadband during the period from the initial time t0 to time ta. Thus, degradation score ΣD(N) is kept at zero. During the period from time ta to time tb, in which D(N)>Dtr+, score D(N) is added to degradation score ΣD(N), thereby causing degradation score ΣD(N) to increase in the positive direction. During the period from time tb to time tc, in which score D(N) is, again, within the deadband, while score D(N) is not added to degradation score ΣD(N), the absolute value of degradation score ΣD(N) gradually decreases and approaches zero due to the effects of an attenuation coefficient γ (described later). After time tc at which D(N)<Dtr−, degradation score ΣD(N) increases in the negative direction.

As degradation score ΣD(N) exceeds threshold TH at time td, the absolute value of charging power upper limit Win of battery 10 is reduced less than W0 (Win involvement). For example, while vehicle 1 is travelling, the power generated through the regenerative braking of motor generator 52 is reduced in accordance with charging power upper limit Win. This causes score D(N) and degradation score ΣD(N) to turn to approach zero, thereby avoiding battery 10 to be further charged. Accordingly, a further increase in the unevenness in salt concentration on a charging side can be avoided.

<Unevenness in Salt Concentration>

As mentioned above, as a large current (high rate) is charged to or discharged from battery 10, the unevenness in salt concentration can occur within the electrode body 15. The inventors focused on the fact that two types of unevenness in salt concentration are present.

Figure 6:
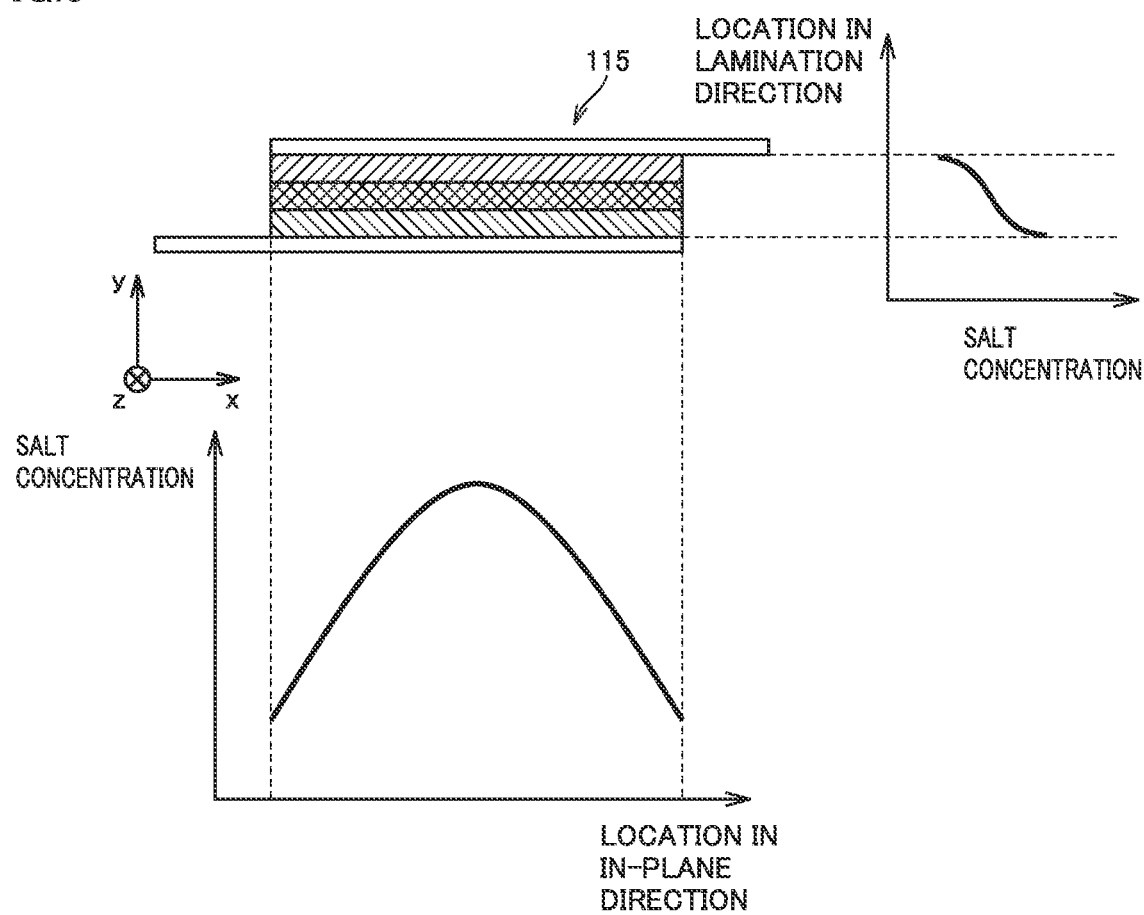
FIG. 6 is a schematic diagram for illustrating unevenness in lithium-ion concentration distribution caused within an electrode body.

FIG. 6 is a schematic diagram for illustrating a biased lithium-ion concentration distribution (the unevenness in salt concentration) caused within electrode body 15. To aid in understanding, FIG. 6 shows, again, the configuration of electrode body 15 described with respect to FIG. 3.

The unevenness in salt concentration occurs in the in-plane direction (x direction), in addition to the lamination direction in which the layers of positive electrode 116, negative electrode 117, etc. are laminated in electrode body 15 (y direction). FIG. 6 shows one example unevenness in salt concentration in the lamination direction, and one example unevenness in salt concentration in the in-plane direction.

The two types of unevenness in salt concentration occur in sequence. At the high rate charging, for example, first, the unevenness in salt concentration occurs in the lamination direction. If the high rate charging continues, negative electrode 117 is swollen, which pushes the electrolyte solution held in electrode body 15 (negative electrode 117) out of the electrode body 15. The spillage of the electrolyte solution causes the unevenness in salt concentration in the in-plane direction. Similarly, in high rate discharging, the unevenness in salt concentration occurs in the lamination direction and then in the in-plane direction.

Note that, as described herein, the unevenness in salt concentration in the in-plane direction results from changes in volume of electrode body 15 (swelling and contraction). Accordingly, the presence or absence of development of the unevenness in salt concentration in the in-plane direction (the salt concentration distribution) can be estimated from variations in load applied to battery case 111.

The unevenness in salt concentration in the in-plane direction does not occur immediately after the development of the unevenness in salt concentration in the lamination direction. The unevenness in salt concentration in the in-plane direction does not occur, unless charging or discharging of battery 10 continues after the development of the unevenness in salt concentration in the lamination direction. The susceptibility of the salt concentration to unevenness in the in-plane direction (the rate of progression of the unevenness in salt concentration in the in-plane direction) depends on SOC of battery 10.

Figure 7:
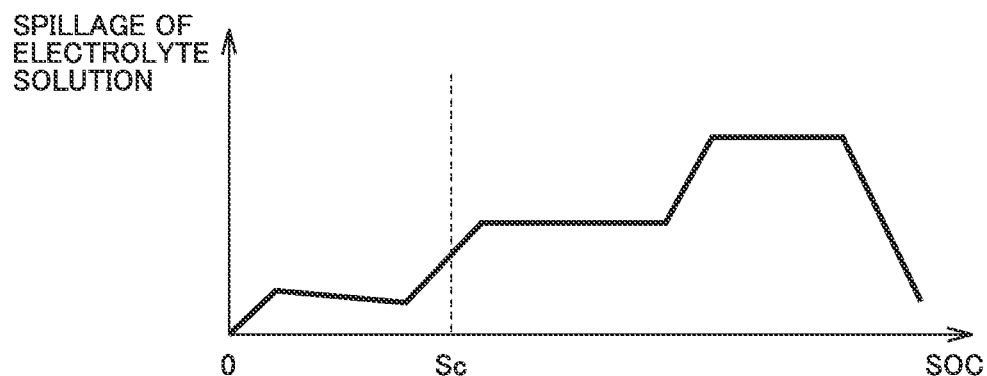
FIG. 7 is a schematic diagram for illustrating SOC (State Of Charge) dependency of the susceptibility of salt concentration of the electrode body to unevenness in the in-plane direction.

FIG. 7 is a schematic diagram for illustrating the SOC dependency of the susceptibility of the salt concentration of electrode body 15 to unevenness in the in-plane direction. In FIG. 7, SOC of battery 10 is represented on the horizontal axis. The spillage of the electrolyte solution out of the electrode body 15 is represented on the vertical axis. According to the above-mentioned mechanism, one can read the vertical axis as the susceptibility of the salt concentration to unevenness in the in-plane direction.

In the example shown in FIG. 7, in the low SOC regime where SOC is in a range from 0% to Sc, the electrolyte solution is less likely to spill out of the electrode body 15, as compared to a middle SOC regime and a high SOC regime where SOC is Sc or above. Thus, the unevenness in salt concentration in the in-plane direction is less likely to occur in the low SOC regime, as compared to the middle SOC regime and the high SOC regime.

Without taking into account the order of development of the unevenness in salt concentration in the in-plane direction and the lamination direction and the SOC dependency of the unevenness in salt concentration in the in-plane direction as described herein, the degree of progression of the high-rate degradation of battery 10 may not be evaluated properly.

For example, in EV, SOC of the battery gradually decreases from a high SOC regime to a low SOC regime. In HV, in contrast, often, charging and discharging of the battery is repeated within a predetermined SOC regime. Accordingly, compared to EV, vehicle 1, which is an HV, has less variations in SOC of battery 10. In the example shown in FIG. 7, even in a situation where the variations in SOC of battery 10 remain within the low SOC regime, if score D(N) is continuously integrated, without taking into account the fact that the salt concentration of electrode body 15 is susceptible to unevenness in the in-plane direction, a too big degradation score ΣD(N) may result. Stated differently, the degree of progression of the high-rate degradation of battery 10 may be overestimated. Consequently, for example, Win involvement, which is otherwise unnecessary, may be performed, causing regenerative electric power not to be completely collected into battery 10, and diminished fuel economy of vehicle 1 may result.

Thus, the present embodiment introduces a score for evaluating the unevenness in salt concentration in the in-plane direction. The score will be described as an "in-plane score η." An integrated value of in-plane score η will be described as an "in-plane integrated score Ση." The introduction of the in-plane score η to the degradation score calculation process allows a degree of progression of the high-rate degradation of battery 10 to be evaluated with accuracy, because it takes into account the order of development of unevenness in salt concentration in the in-plane direction and the lamination direction and the SOC dependency of the unevenness in salt concentration in the in-plane direction. In Embodiment 1, the degradation score calculation process with a "reset scheme" will be described.

<Reset Scheme Process Flow>

Figure 8:
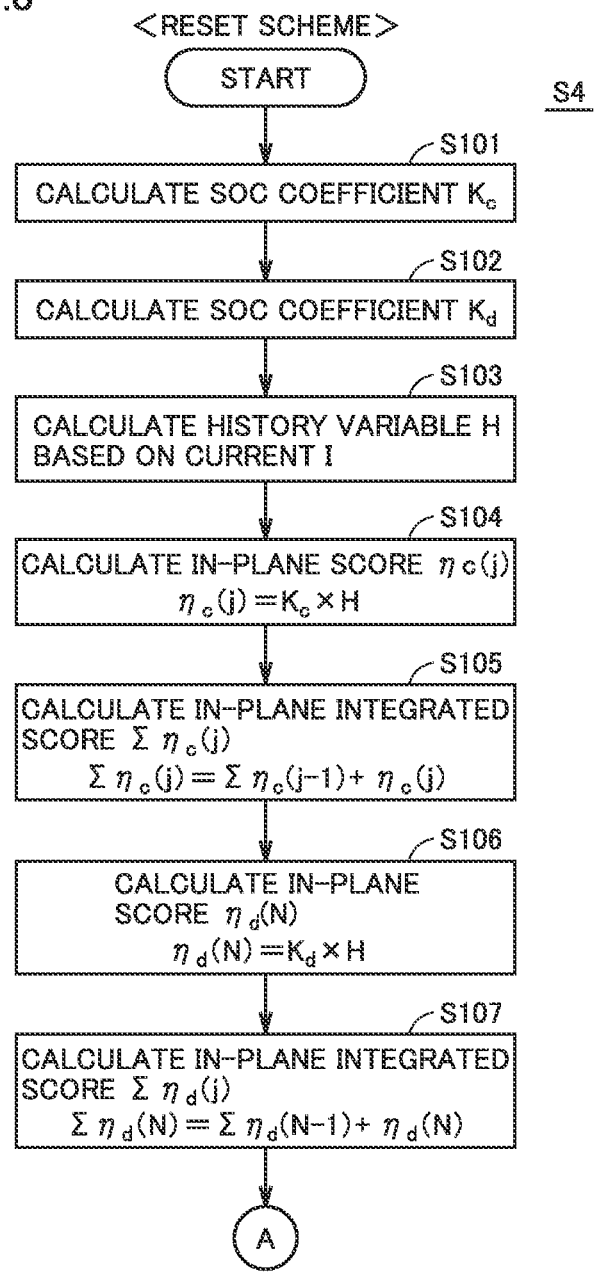
FIG. 8 is a flowchart (a first diagram) showing a procedure of a degradation score calculation process with a reset scheme.
Figure 9:
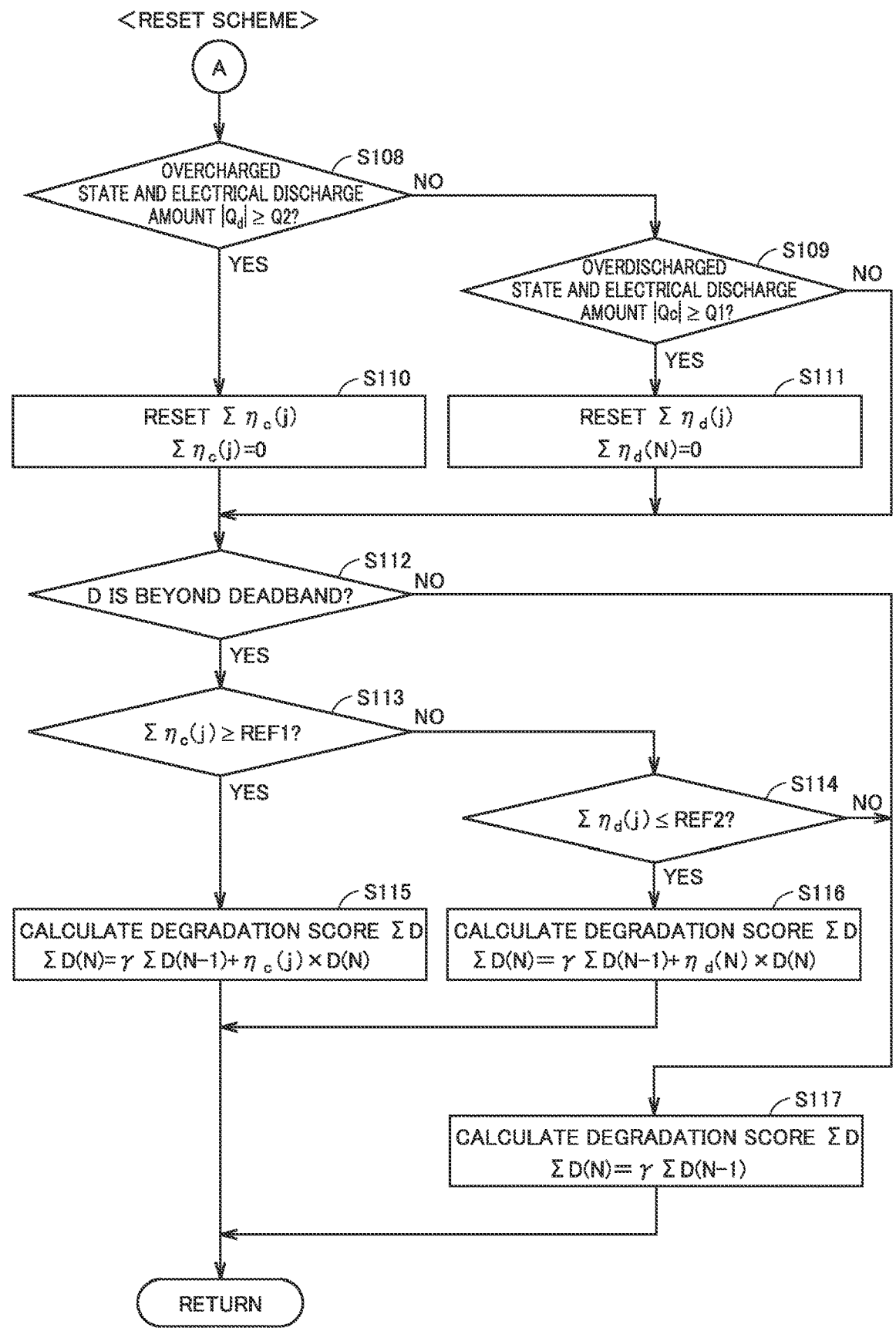
FIG. 9 is a flowchart (a second diagram) showing the degradation score calculation process with the reset scheme.

FIGS. 8 and 9 are flowcharts showing a procedure of the degradation score calculation process with a reset scheme (S4 of FIG. 4). In this example, the in-plane score $\eta_c$ for battery 10 on a charging side and the in-plane score $\eta_d$ for battery 10 on a discharging side are separately calculated.

Referring to FIG. 8, in S101, ECU 30 calculates an SOC coefficient, based on SOC of battery 10. The SOC coefficient is a parameter representing the susceptibility of salt concentration to unevenness in the in-plane direction, and can depend on SOC of battery 10. Separate SOC coefficients can be determined for battery 10 on the charging side and on the discharging side. The SOC coefficient for battery 10 on the charging side will be described as $K_c$, and the SOC coefficient for battery 10 on the discharging side will be described as $K_d$.

Figure 10:
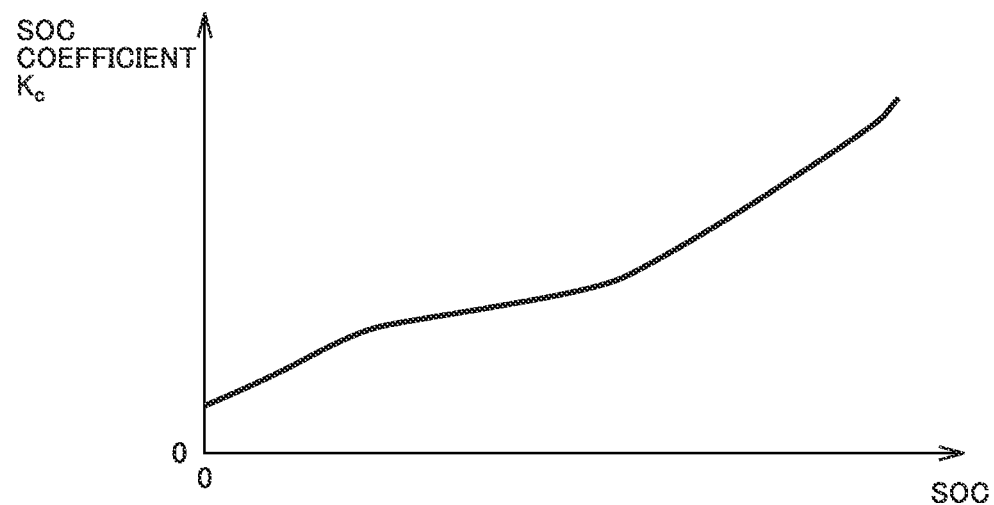
FIG. 10 is a diagram illustrating one example of deadband coefficient calculation approach.

FIG. 10 is a diagram illustrating one example of an SOC coefficient $K_c$ calculation approach. In FIG. 10, SOC of battery 10 is represented on the horizontal axis, and SOC coefficient $K_c$ is represented on the vertical axis. The more susceptible the salt concentration of electrode body 15 in the in-plane direction to unevenness, the greater the SOC coefficient $K_c$ is. As illustrated in FIG. 7, in the case where the salt concentration is less susceptible to unevenness in the low SOC regime, and the salt concentration is more susceptible to unevenness with an increase of SOC, the higher the SOC is, the greater the SOC coefficient $K_c$ is.

In advance, the relationship, as shown in FIG. 10, of SOC of battery 10 and SOC coefficient $K_c$ is determined and stored in memory 32 of ECU 30, as a map or a transform. This allows ECU 30 to calculate SOC coefficient $K_c$ from SOC of battery 10.

In addition to the SOC dependency, the temperature dependency may be reflected in SOC coefficient $K_c$. In this case, the relationship of SOC and temperature T of battery 10 and SOC coefficient $K_c$ can be determined in advance, for example, as a three-dimensional map. SOC coefficient $K_c$ increases with an increase of SOC of battery 10 and with an increase of temperature T of battery 10.

Referring, again, to FIG. 8, in S102, ECU 30 calculates SOC coefficient $K_d$ on the discharging side, in a similar manner to the way the SOC coefficient $K_c$ is calculated on the charging side.

In S103, ECU 30 calculates a history variable H representing a charging and discharging history of battery 10. In general, the charging and discharging history of the battery is represented by the direction and magnitude of the current that is charged to and discharged from the battery. Thus, history variable H is a parameter dependent on current I, and calculated at least based on current I.

Figure 11:
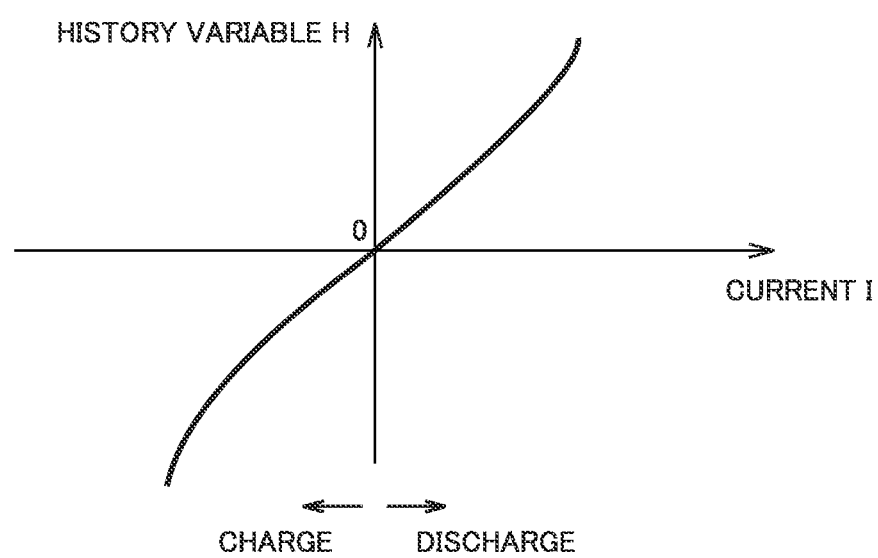
FIG. 11 is a diagram illustrating one example of a history variable calculation approach.

FIG. 11 is a diagram illustrating one example of a history variable H calculation approach. In FIG. 11, current I charged to and discharged from battery 10 is indicated on the horizontal axis, and history variable H is indicated on the vertical axis. History variable H can be a positive value and a negative value. In the example shown in FIG. 11, when history variable H is positive, current I is positive, and when history variable H is negative, current I is negative. The greater the absolute value of current I, the greater the absolute value of history variable H.

As with SOC coefficient $K_c$ (or $K_d$), history variable H can be calculated from current I of battery 10 by pre-defining the relationship of current I of battery 10 and history variable H as a map, for example. While the computing cycle is not described with an ordinal term, SOC coefficients $K_c$, $K_d$ and history variable H are calculated with respect to the N-th computing cycle.

Returning to FIG. 8, in S104, ECU 30 multiplies SOC coefficient $K_c$ by history variable H on the charging side, thereby calculating the in-plane score $\eta_c(N)$ on the charging side in the N-th computing cycle (see Equation (4) below).

$$\eta_c(N) = K_c \times H \tag{4}$$

In S105, using in-plane score $\eta_c(N)$ calculated in S104, ECU 30 calculates in-plane integrated score $\Sigma\eta_c(N)$ on the charging side up to the N-th computing cycle. In-plane integrated score $\Sigma\eta_c(N)$ is calculated by adding the N-th in-plane score $\eta_c(N)$ to in-plane integrated score $\Sigma\eta_c(N-1)$ up to (N−1)-th computing cycle, as indicated by Equation (5):

$$\Sigma\eta_c(N) = \Sigma\eta_c(N-1) + \eta_c(N) \tag{5}$$

As with battery 10 on the charging side, ECU 30 multiples SOC coefficient $K_d$ by history variable H for battery 10 on the discharging side, thereby calculating in-plane score $\eta_d(N)$ on the discharging side in the N-th computing cycle (see Equation (6) below) (S106). ECU 30 also calculates in-plane integrated score $\Sigma\eta_d(N)$ for battery 10 on the discharging side by integrating the in-plane score $\eta_d(N)$ on the discharging side (see Equation (7) below) (S107).

$$\eta_d(N) = K_d \times H \tag{6}$$

$$\Sigma\eta_d(N) = \Sigma\eta_d(N-1) + \eta_d(N) \tag{7}$$

Even though charging and discharging of battery 10 are repeatedly, if an amount of electrical charges charged to battery 10 [unit: Ah] is significantly greater than an amount of electrical charges discharged from battery 10, battery 10 is brought into the overcharged state, which can cause the unevenness in salt concentration on the charging side. As battery 10 in the overcharged state is discharged to some extent, the unevenness in salt concentration on the charging side can be eliminated. In contrast, if the electrical discharge amount is significantly greater than the electrical charge amount, battery 10 is brought into the overdischarged state, which can cause the unevenness in salt concentration on the discharging side. The unevenness in salt concentration on the discharging side can be eliminated as the battery 10 in the overdischarged state is charged.

Referring to FIG. 9, in S108, ECU 30 determines whether battery 10 is in the overcharged state and the absolute value of electrical discharge amount $Q_d$ which has been discharged from battery 10 since battery 10 is brought into the overcharged state to the present is greater than or equal to a predetermined decision value Q2. Electrical discharge amount $Q_d$ can be calculated from current I discharged from battery 10 and an elapsed time. Instead of electrical discharge amount $Q_d$, the amount of electric power discharged from battery 10 [unit: Wh] may be used.

Decision value Q2 can be determined as follows. A cell is prepared whose salt concentration of electrode body 15 in the in-plane direction is in unevenness on the charging side. The cell is caused to discharge, and an electric charge amount that is discharged from the cell until the unevenness in salt concentration on the charging side is eliminated, is measured, at which time the variation behavior of the load applied to battery case 111 is measured as well. With this, electrical discharge amount $Q_d$, discharged until ECU 30 determines based on the load variation that the unevenness in salt concentration in the in-plane direction has been eliminated, can be set as decision value Q2.

If the absolute value of electrical discharge amount $Q_d$ is greater than or equal to decision value Q2 (YES in S108), this suggests that the elimination of the unevenness in salt concentration on the charging side may have progressed by overcharged battery 10 being discharged. In this case, ECU 30 passes the process to S110, and resets the in-plane integrated score $\Sigma\eta_c(N)$ calculated on the charging side. In other words, ECU 30 sets $\Sigma\eta_c(N)=0$. Then, ECU 30 passes the process to S112.

In contrast, if the absolute value of electrical discharge amount $Q_d$ is less than decision value Q2 in S108 (NO in S108), ECU 30 determines whether battery 10 is in the overdischarged state and the absolute value of electrical charge amount $Q_c$ which has been charged to battery 10 since battery 10 is brought into the overdischarged state to the present is greater than or equal to a predetermined decision value Q1 (S109).

If the absolute value of electrical charge amount $Q_c$ is greater than or equal to decision value Q1, this suggests that the elimination of the unevenness in salt concentration on the discharging side may have progressed by overdischarged battery 10 being charged. Accordingly, if S109 is YES, ECU 30 resets in-plane integrated score $\Sigma\eta_d(N)$ on the discharging side (S111). Then, ECU 30 passes the process to S112. Note that, as with decision value Q2, decision value Q1 can also be set by measuring, in advance, the electrical charge amount $Q_c$ until the unevenness in salt concentration in the in-plane direction is eliminated.

If the absolute value of electrical discharge amount $Q_d$ is less than decision value Q2 and the absolute value of electrical charge amount $Q_c$ is less than decision value Q1 (NO in S108 and NO in S109), ECU 30 skips S110, S111 and passes the process to S112. In this case, ECU 30 continues to integrate in-plane scores $\partial_c$, $\eta_d$.

In S112, ECU 30 determines whether score D(N) calculated in S3 (see FIG. 4) is beyond the deadband defined by two thresholds Dtr+, Dtr−. If score D(N) is beyond the deadband, that is score D(N) is greater than the threshold Dtr+ or less than the threshold Dtr− (YES in S112), ECU 30 passes the process to S113.

In S113, ECU 30 determines whether the absolute value of in-plane integrated score $\Sigma\eta_c(N)$ on the charging side is greater than or equal to a predetermined first reference value REF1. The magnitude of first reference value REF1 is set greater than or equal to the maximum that the absolute value of in-plane integrated score $\Sigma\eta_c(N)$ on the charging side can instantaneously take when vehicle 1 travels in a travel pattern that renders the salt concentration susceptible to unevenness on the charging side.

If in-plane integrated score $\Sigma\eta_c(N)$ on the charging side is greater than or equal to first reference value REF1 (YES in S113), that is, in-plane score $\eta_c$ is sufficiently integrated, without resetting in-plane integrated score $\Sigma\eta_c(N)$ on the charging side, the unevenness in salt concentration on the charging side may be occurring in the in-plane direction of electrode body 15, in addition to the lamination direction. In this case, ECU 30 calculates degradation score $\Sigma D$ according to Equation (8) below, taking into account the unevenness in salt concentration in both the lamination direction and the in-plane direction (S115).

$$\Sigma D(N)=\gamma\Sigma D(N-1)+\eta_c(N)\times D(N) \qquad (8)$$

Inside the electrode body 15, the unevenness in salt concentration in the in-plane direction does not occur, without the development of the unevenness in salt concentration in the lamination direction. In order to evaluate the unevenness in salt concentration in the in-plane direction with the unevenness in salt concentration in the lamination direction as a precondition, the in-plane score $\eta_c(N)$ is multiplied by score D(N) in Equation (8). If the unevenness in salt concentration is not caused in the lamination direction, D(N)=0, and $\eta_c(N)\times D(N)$ is zero, accordingly.

Note that, in Equation (8), $\gamma$ is attenuation coefficient. Since the unevenness in salt concentration is mitigated over time by diffusion of the lithium-ions, the integrated score $\Sigma D(N)$ for the current computing cycle is less than the integrated score $\Sigma D(N-1)$ for the immediately preceding computing cycle. This is taken into account by setting attenuation coefficient $\gamma$ to a value less than 1 (e.g., $\gamma=0.9997$). A predetermined value stored in memory 32 is used as attenuation coefficient $\gamma$.

In S113, if in-plane integrated score $\Sigma\eta_c(N)$ on the charging side is determined to be less than first reference value REF1 (NO in S113), ECU 30 determines whether in-plane integrated score $\Sigma\eta_d(N)$ on the discharging side is less than or equal to a predetermined second reference value REF2 (S114). Since in-plane integrated score $\Sigma\eta_d(N)$ on the discharging side is negative, ECU 30 determines, in S114, whether the absolute value of the in-plane integrated score $\Sigma\eta_d(N)$ on the discharging side is less than or equal to the magnitude of second reference value REF2. The magnitude of second reference value REF2 is set greater than or equal to the maximum that the absolute value of the in-plane integrated score $\Sigma\eta_d(N)$ on the discharging side can instantaneously take when vehicle 1 travels in a travel pattern that renders the salt concentration susceptible to unevenness on the discharging side. The magnitude of first reference value REF1 and the magnitude of second reference value REF2 may be different.

If in-plane integrated score $\Sigma\eta_d(N)$ on the discharging side is determined to be less than or equal to second reference value REF2 (YES in S114), that is, in-plane score $\eta_d$ on the discharging side is sufficiently integrated, without resetting in-plane integrated score $\Sigma\eta_d(N)$ on the discharging side, then, ECU 30 calculates degradation score $\Sigma D$ according to Equation (9) below, taking into account the unevenness in salt concentration in both the lamination direction and the in-plane direction (S115).

$$\Sigma D(N) = \gamma \Sigma D(N-1) + \eta_d(N) \times D(N) \quad (9)$$

In S112, if score D(N) is within the deadband (NO in S112), there is no need to integrate score D(N). Thus, ECU 30 passes the process to S117. If in-plane integrated score $\Sigma \eta_c(N)$ on the charging side is determined to be less than first reference value REF1 and in-plane integrated score $\Sigma \eta_d(N)$ on the discharging side is determined to be greater than second reference value REF2 (NO in S113 and NO in S114), this suggests that the in-plane score $\eta_c$ (or $\eta_d$) is not sufficiently integrated since in-plane integrated score $\Sigma \eta_c(N)$ (or $\Sigma \eta_d(N)$) has been reset. Accordingly, ECU 30 determines that there is no need to take into account a new development of unevenness in salt concentration, and passes the process to S117.

In S117, ECU 30 calculates degradation score $\Sigma D$, according to Equation (10):

$$\Sigma D(N) = \gamma \Sigma D(N-1) \quad (10)$$

After any of S115 through S117 is performed, ECU 30 returns the process to the main routine. This causes degradation score $\Sigma D$ to be updated for every predetermined computing cycle.

As described above, in Embodiment 1, in addition to score D, in-plane scores $\eta_c$, $\eta_d$ are calculated. The in-plane scores $\eta_c$, $\eta_d$ are calculated, taking into account the order of development of unevenness in salt concentration in the lamination direction and unevenness in salt concentration in the in-plane direction, and the SOC dependency of the susceptibility of salt concentration to unevenness in the in-plane direction (SOC coefficients $K_c$, $K_d$). The degree of progression of unevenness in salt concentration within electrode body 15 can be more accurately quantified by applying the generation mechanism of the unevenness in salt concentration in the in-plane direction to degradation score $\Sigma D$ as such. Consequently, according to Embodiment 1, the degree of progression of the high-rate degradation of battery 10 can be evaluated with an enhanced accuracy.

Note that score D corresponds to a "first score" according to the present disclosure. The in-plane scores $\eta_c$, $\eta_d$ correspond to a "second score" according to the present disclosure. Degradation score $\Sigma D$ corresponds to a "first integrated value" according to the present disclosure. In-plane integrated scores $\Sigma \eta_c$, $\Sigma \eta_d$ correspond to a "second integrated value" according to the present disclosure.

Embodiment 2

While the degradation score calculation process with the reset scheme is described in Embodiment 1, the specific procedure of the degradation score calculation process is not limited thereto. In Embodiment 2, the degradation score calculation process with a "subtraction scheme" will be described. Note that Embodiment 2 has the same battery system, vehicle configuration, and cell configuration as Embodiment 1 (see FIGS. 1 through 3).

<Subtraction Scheme Process Flow>

FIG. 12 is a flowchart showing a procedure of the degradation score calculation process with a subtraction scheme. The first half of the series of processes included in the degradation score calculation process with a subtraction scheme is the same as the first half (S101 through S107 of FIG. 8) of the degradation score calculation process with the reset scheme described in Embodiment 1, and thus is not shown in the figure. The degradation score calculation process with a subtraction scheme is the same as the degradation score calculation process with the reset scheme, except for including S208 through S211, in place of S108 through S111.

In S208, ECU 30 determines whether overcharged battery 10 is being discharged. If overcharged battery 10 is being discharged (YES in S208), ECU 30 subtracts a degree of elimination of the unevenness in salt concentration in the in-plane direction on the charging side from in-plane integrated score $\Sigma \eta_c(N-1)$ on the charging side for the immediately preceding computing cycle (S210), according to Equation (11):

$$\Sigma \eta_c(N) = \Sigma \eta_c(N-1) - L_d \times I \quad (11)$$

As indicated by Equation (11), the degree of elimination of the unevenness in salt concentration in the in-plane direction on the discharging side can be calculated by multiplying the charging current I charged to battery 10 by a predetermined coefficient $L_d$. Coefficient $L_d$ can be set based on the relationship of discharging current I discharged from battery 10 and variations in load applied to battery case 111. Coefficient $L_d$ may be set based on SOC of battery 10.

If battery 10 is in the overcharged state, in-plane score $\Sigma \eta_c(N-1)$ on the charging side is positive. Since discharging current I is a positive value and coefficient $L_d$ is a positive value, $(-L_d \times I)$ results in a negative value. Accordingly, the absolute value of in-plane integrated score $\Sigma \eta_c(N)$ for the current computing cycle is less than the absolute value of in-plane integrated score $\Sigma \eta_c(N-1)$ for the immediately preceding computing cycle by $(-L_d \times I)$.

If overcharged battery 10 is not being discharged (NO in S208), ECU 30 passes the process to S209, and determines whether battery 10 in the overdischarged state is being charged. If battery 10 in the overdischarged state is being charged (YES in S209), ECU 30 subtracts a degree of elimination of the unevenness in salt concentration in the in-plane direction on the charging side from in-plane integrated score $\Sigma \eta_d(N-1)$ on the discharging side for the immediately preceding computing cycle (S211), according Equation (12):

$$\Sigma \eta_d(N) = \Sigma \eta_d(N-1) - L_c \times I \quad (12)$$

As with Equation (11), in Equation (12), the degree of elimination of the unevenness in salt concentration in the in-plane direction on the charging side can be calculated by multiplying the charging current I charged to battery 10 by a predetermined coefficient $L_c$. As with coefficient $L_d$, coefficient $L_c$ is set based on variations in the load applied to battery case 111, and the SOC dependency can be taken into account. Note that, for simplicity, coefficient $L_c$ and coefficient $L_d$ may have the same value.

If battery 10 is in the overdischarged state, in-plane score $\Sigma \eta_d(N-1)$ on the discharging side is negative. Since charging current I is a negative value and coefficient $L_c$ is a positive value, $(-L_c \times I)$ results in a positive value. Accordingly, the absolute value of in-plane integrated score $\Sigma \eta_d(N)$ for the current computing cycle is less than the absolute value of the in-plane integrated score $\Sigma \eta_d(N-1)$ for the immediately preceding computing cycle by $(-L_c \times I)$.

If battery 10 is not overcharged and not being discharged, and battery 10 is not overdischarged and not being charged (NO in S208 and NO in S209), S210 and S211 are skipped and the process is passed to S212. Steps S212 through S217 are the same as S112 through S117 (see FIG. 9) for the reset scheme, and thus the description thereof will not be repeated.

As described above, in Embodiment 2, the degradation score calculation process with the subtraction scheme is performed, instead of one with the reset scheme. According to Embodiment 2, the reset scheme is a simplified computational scheme representing the elimination of the concentration unevenness by resetting in-plane integrated scores $\Sigma\eta_c$, $\Sigma\eta_d$ to zero, based on an amount of electric charges stored in battery 10 after battery 10 is switched between being charged and being discharged. The subtraction scheme, in contrast, sequentially subtracts, after battery 10 is switched between being charged and being discharged, a degree of elimination of unevenness in salt concentration in the in-plane direction. Thus, it can be said that the subtraction scheme well represents gradual mitigation of the unevenness in salt concentration. As compared to the reset scheme, with the subtraction scheme, while a heavier computational load is caused, the degree of progression of unevenness in salt concentration within electrode body 15 (a degree of mitigation of unevenness in salt concentration) can be more accurately quantified. Thus, according Embodiment 2, the degree of progression of the high-rate degradation of battery 10 can be evaluated with an increased accuracy.

Although the present disclosure has been described and illustrated in detail, it is clearly understood that the same is by way of illustration and example only and is not to be taken by way of limitation, the scope of the present disclosure being interpreted by the terms of the appended claims.

What is claimed is:

1. A battery system, comprising:
   a lithium-ion battery that includes an electrode body, the electrode body including a positive electrode and a negative electrode, each being a planar electrode, being laminated each other, the electrode body being impregnated in an electrolyte solution,
   a current sensor that detects a current charged to and discharged from the lithium-ion battery; and
   a processor that evaluates degradation of the lithium-ion battery, using a first score and a second score, the degradation being a phenomenon that an internal resistance of the lithium-ion battery increases with development of unevenness in a lithium-ion concentration distribution within the electrode body, wherein
   the first score is an index for evaluating the unevenness in lithium-ion concentration distribution in a lamination direction in which the positive electrode and the negative electrode are laminated,
   the second score is an index for evaluating the unevenness in lithium-ion concentration distribution in an in-plane direction of the positive electrode and the negative electrode, wherein
   the processor:
     determines a state of charge (SOC) of the lithium-ion battery;
     for each computing cycle, calculates a current first score based on the SOC, and calculates a current second score based on a detection value of the current sensor;
     when an absolute value of a second integrated value obtained by integrating the second score is beyond a reference value, evaluates the degradation of the lithium-ion battery based on the current first score, the current second score, and a first integrated value, which is obtained by integrating previous first scores beyond a predetermined range, and wherein the first integrated value is calculated by multiplying the first integrated value of an immediately precedent computing cycle with an attenuation factor, and, if the current first score is beyond a deadband, adding the current first score multiplied by the current second score; and
     when the absolute value is below the reference value, evaluates the degradation of the lithium-ion battery based on the first integrated value without using the current first score and the current second score, the first integrated value being calculated by multiplying the first integrated value of the immediately precedent computing cycle with the attenuation factor.

2. The battery system according to claim 1, wherein the processor:
   corrects the first integrated value using a correction coefficient representing mitigation of the unevenness in lithium-ion concentration distribution over time,
   when the absolute value is beyond the reference value, evaluates the degradation of the lithium-ion battery by adding a product of the current first score and the current second score to the first integrated value corrected by the correction coefficient; and
   when the absolute value is below the reference value, evaluates the degradation of the lithium-ion battery based on the first integrated value corrected by the correction coefficient.

3. The battery system according to claim 1, wherein when an amount of electrical charges charged to the lithium-ion battery in an overdischarged state is beyond a first decision value or when an amount of electrical charges discharged from the lithium-ion battery in an overcharged state is beyond a second decision value, the processor resets the second integrated value.

4. The battery system according to claim 1, wherein the processor subtracts the current second score from the second integrated value for each computing cycle when the lithium-ion battery in an overdischarged state is being charged or when the lithium-ion battery in an overcharged state is being discharged.

5. The battery system according to claim 1, further comprising
   a temperature sensor that detects a temperature of the lithium-ion battery, wherein
   the processor calculates the second score based on the SOC and the temperature of the lithium-ion battery.

6. A method for evaluating degradation of a lithium-ion battery which includes an electrode body, the electrode body including a positive electrode and a negative electrode, each being a planar electrode, being laminated each other, the lithium-ion battery being impregnated in an electrolyte solution, wherein
   the degradation of the lithium-ion battery is evaluated, using a first score and a second score, the degradation being a phenomenon that an internal resistance of the lithium-ion battery increases with development of an unevenness in a lithium-ion concentration distribution within the electrode body,
   the first score is an index for evaluating the unevenness in lithium-ion concentration distribution in a lamination direction in which the positive electrode and the negative electrode are laminated, and
   the second score is an index for evaluating the unevenness in lithium-ion concentration distribution in an in-plane direction of the positive electrode and the negative electrode,
   the method, comprising:
     determining a state of charge (SOC) of the lithium-ion battery;

for each computing cycle, calculating a current first score based on the SOC, and calculating a current second score based on a current charged to and discharged from the lithium-ion battery;

when an absolute value of a second integrated value obtained by integrating the second score is beyond a reference value, evaluating the degradation of the lithium-ion battery based on the current first score, the current second score, and a first integrated value which is obtained by integrating previous first scores beyond a predetermined range, and wherein the first integrated value is calculated by multiplying the first integrated value of an immediately precedent computing cycle with an attenuation factor, and, if the current first score is beyond a deadband, adding the current first score multiplied by the current second score; and when the absolute value is below the reference value, evaluating the degradation of the lithium-ion battery based on the first integrated value without using the current first score and the current second score, the first integrated value being calculated by multiplying the first integrated value of the immediately precedent computing cycle with the attenuation factor.

* * * * *